United States Patent [19]

Kouzuma et al.

[11] Patent Number: 5,069,727
[45] Date of Patent: Dec. 3, 1991

[54] FLEXIBLE PHOTOVOLTAIC DEVICE AND MANUFACTURING METHOD THEREOF

[75] Inventors: Shinichi Kouzuma; Hiroshi Inoue; Kenji Murata; Hiroyuki Tanaka; Yasuo Kishi, all of Osaka, Japan

[73] Assignee: Sanyo Electric Co., Ltd., Moriguchi, Japan

[21] Appl. No.: 578,088

[22] Filed: Sep. 5, 1990

[30] Foreign Application Priority Data

Sep. 6, 1989 [JP] Japan .................. 1-104660
Sep. 18, 1989 [JP] Japan .................. 1-242768
Sep. 27, 1989 [JP] Japan .................. 1-252665

[51] Int. Cl.⁵ ............... H01L 31/048; H01L 31/18
[52] U.S. Cl. .................... 136/251; 136/259; 437/2; 437/4
[58] Field of Search ........... 136/244, 245, 251, 259; 437/2-5, 180, 209

[56] References Cited

U.S. PATENT DOCUMENTS 4,888,061 12/1989 Wenz ........................ 136/251

FOREIGN PATENT DOCUMENTS

| 60-214550 | 10/1985 | Japan | 136/251 |
| 63-9159 | 1/1988 | Japan | 136/251 |
| 1-105581 | 4/1989 | Japan | 437/4 |
| 1-119072 | 5/1989 | Japan | 136/245 |
| 1-119073 | 5/1989 | Japan | 136/245 |

Primary Examiner—Aaron Weisstuch
Attorney, Agent, or Firm—D. H. Kane, Jr.; W. G. Fasse

[57] ABSTRACT

A flexible photovoltaic device comprises a first transparent, insulating, and flexible resin layer; a transparent electrode formed on the first resin layer; a flexible resin type locking member formed having satisfactory adherence along the inner periphery of the transparent electrode; a semiconductor layer formed to cover the transparent electrode and the locking member for photoelectric conversion; a back electrode formed on the semiconductor layer; and a second insulating and flexible resin layer formed on the back electrode.

19 Claims, 6 Drawing Sheets

FLEXIBLE PHOTOVOLTAIC DEVICE AND MANUFACTURING METHOD THEREOF

BACKGROUND OF THE INVENTION

1. Field of the Invention

The present invention relates to a flexible photovoltaic device and improvement in the manufacturing method therefor.

2. Description of the Background Art

A flexible photovoltaic device and the manufacturing method thereof is described in Japanese Patent Laying-Open No. 1-105581, for example.

Figure 1:
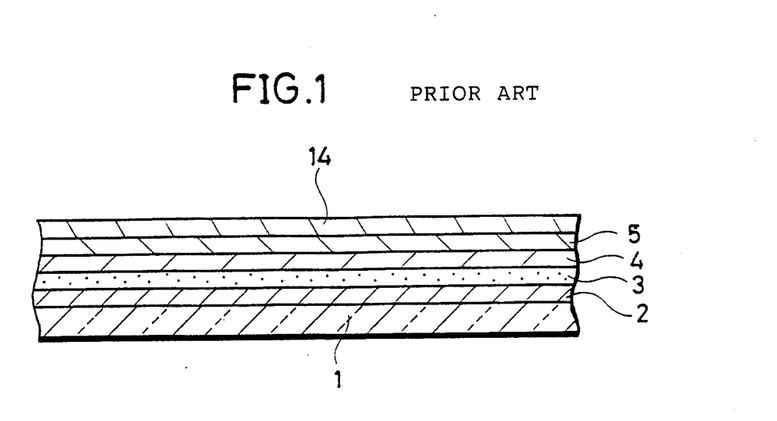
FIGS. 1-3 are sectional views showing the manufacturing steps of a flexible photovoltaic device by prior art.

Referring to FIG. 1, a first resin layer 2 of polyimide resin with superior heat resistance is formed on a supporting substrate 1 such as of glass. The first resin layer 2 is transparent and insulating, as well as flexible. A transparent electrode 3, a thin film semiconductor layer 4 for photoelectric conversion, and a back metal electrode 5 are layered in sequence on the first resin layer 2. Semiconductor layer 4 comprises a p-i-n junction, a p-n junction or the like parallel to the film face. A second resin layer 14 such as of ethylene vinyl acetate copolymer (EVA) sheet is layered on back electrode 5. The second resin layer 14 is insulating and flexible.

Figure 2:
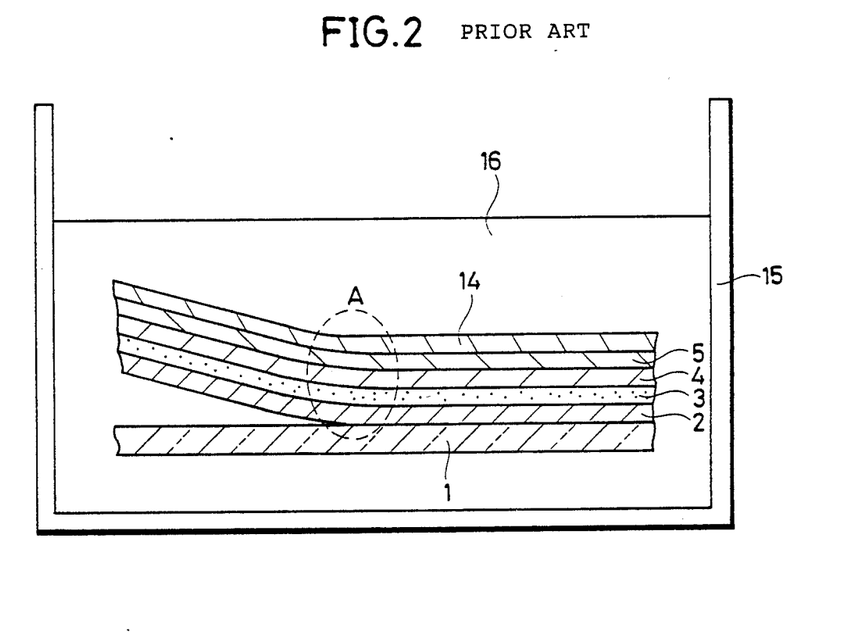

Referring to FIG. 2, the photovoltaic device formed on the supporting substrate 1 is immersed in water 16 of a container 15 to be separated from the supporting substrate 1. This results in a flexible photovoltaic device shown in FIG. 3.

Figure 3:
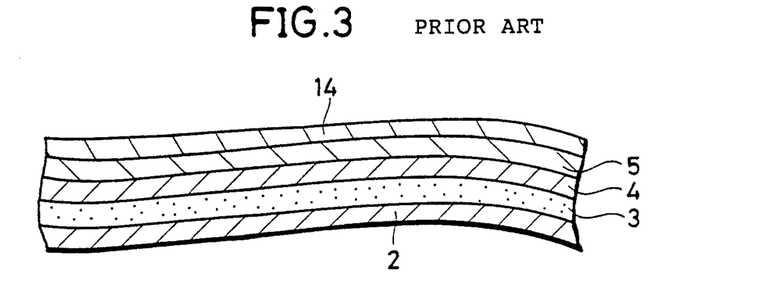

In the flexible photovoltaic device formed in the aforementioned manner, the second resin layer 14 is provided to protect the back metal electrode 5 from water 16. The second resin layer 14 is formed so as to have a shrinking force substantially equal to that of the first resin layer 2, to prevent the flexible photovoltaic device from curling after being separated from the supporting substrate 1.

In the flexible photovoltaic device obtained in such a manner, the layers having a weak bond with each other in the multilayered structure, i.e. the transparent electrode 3 and the semiconductor layer 4, are apt to be separated from each other at the edge of the photovoltaic device, due to mechanical stress such as bending or torsion exerted on the device. If the transparent electrode 3 and the semiconductor layer 4 are locally separated, the photoelectric conversion efficiency will be reduced significantly.

It is preferred that the first resin layer 2 has low adhesion to substrate 1 when the flexible photovoltaic device is separated from the supporting substrate 1. However, the first resin layer 2 must have sufficient adhesion to substrate 1 until the second resin layer 14 is formed. It generally takes a long time of two to three days for water 16 to permeate into the interface of the supporting substrate 1 and the first resin layer 2 to cause natural separation therebetween.

If an additional external force is applied to separate the photovoltaic device from the supporting substrate 1 in a short period, high stress will be generated in the region A surrounded by a broken line in FIG. 2, whereby the transparent electrode 3 and the semiconductor layer 4 are separated from each other locally to degrade the photoelectric conversion efficiency significantly.

Furthermore, because the first resin layer 2 of polyimide resin and the second resin layer 14 of EVA sheet have moisture permeability, local separation may be seen in the semiconductor layer 4 of the layered structure if the photovoltaic device is held in an environment of high humidity for a long time.

SUMMARY OF THE INVENTION

In view of the foregoing, an object of the present invention is to provide a flexible photovoltaic device having a mechanically stable layered structure.

Another object of the present invention is to provide a flexible photovoltaic device that can be formed in a relatively short time and a method of manufacturing thereof.

A further object of the present invention is to provide a flexible photovoltaic device having moisture resistance and a method of manufacturing thereof.

In accordance with one aspect of the present invention, a flexible photovoltaic device comprises a first transparent, insulating, and flexible resin layer; a transparent electrode formed on the first resin layer; a locking member of flexible resin having satisfactory adherence along the inner periphery of the transparent electrode; a semiconductor layer formed covering the transparent electrode and the locking member for photoelectric conversion; a back electrode formed on the semiconductor layer; and a second insulating and flexible resin layer formed on the back electrode.

In accordance with another aspect of the present invention, the method of manufacturing a flexible photovoltaic device comprises the steps of forming a releasing agent layer on a region of the main surface of the supporting substrate 1 excluding the inner peripheral margin of the main surface thereof; forming a first transparent, insulating, and flexible resin layer so as to cover the margin and the releasing agent layer; forming a transparent electrode, a semiconductor layer for photoelectric conversion, and a back electrode in sequence on the first resin layer; forming a second insulating and flexible resin layer on the back electrode; creating a cut in the layered structure from the second resin layer to the first resin layer along the inner periphery of the releasing agent layer; and peeling off the layered structure cut island-like from the releasing agent layer in a relatively short time.

In accordance with a further aspect of the present invention, a flexible photovoltaic device comprises a first transparent, insulating, and flexible resin layer; a transparent electrode formed on one side of the first resin layer; a semiconductor layer formed on the transparent electrode for photoelectric conversion; a back electrode formed on the semiconductor layer; a second insulating and flexible resin layer having shrinking force formed on the back electrode; a third transparent and flexible resin layer having shrinking force formed on the other side of the first resin layer; wherein the bending moment in the photovoltaic device caused by the shrinking force of the second resin layer is cancelled by the bending moment of the shrinking force of the third resin layer.

In accordance with a still further aspect of the present invention, a method of manufacturing a flexible photovoltaic device comprises the steps of forming a first transparent, insulating, and flexible resin layer on the supporting substrate; forming a transparent electrode, a semiconductor layer for photoelectric conversion, and a back plate in sequence on the first resin layer; forming a second insulating and flexible resin layer having shrinking force on the back electrode; separating the first resin layer from the supporting substrate in a relatively short time by using the shrinking force of the second resin layer; forming a third transparent and flexible resin layer having shrinking force on the free surface of the first resin layer; whereby the bending moment in the photovoltaic device caused by the shrinking force of the second resin layer is cancelled by the bending moment caused by the shrinking force of the third resin layer.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

The first embodiment of the present invention will be described in reference to FIGS. 4-10.

Figure 4:
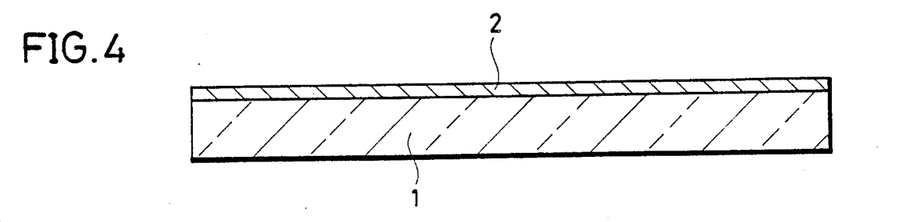
FIGS. 4-9 are sectional views showing the manufacturing steps of a flexible photovoltaic device in accordance with one embodiment of the present invention.

Referring to FIG. 4, a first transparent, insulating and flexible resin layer 2 of organic polymer film is formed on the supporting substrate 1 constituted by glass, ceramic, metal, or the like. A transparent, polyimide varnish, for example, is applied uniformly by a spin coater or a roll coater, and the temperature of the same is raised from 100° C. to 300° C. stepwise, to form the first resin layer 2. It is preferred that the first resin layer 2 has a thickness of not less than 5 $\mu$m from the standpoint of mechanical strength, and a thickness of not more than 100 $\mu$m from the standpoint of transparency.

Figure 5:
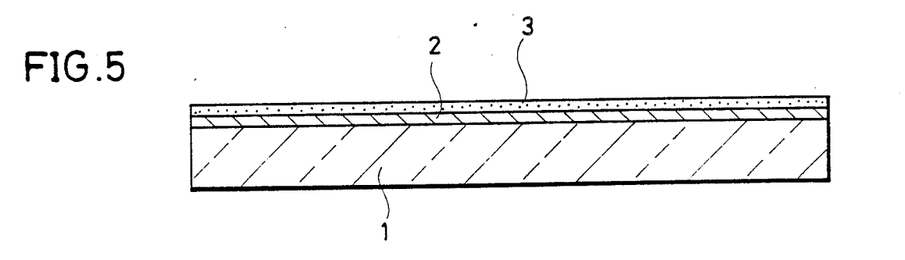

Referring to FIG. 5, a transparent electrode 3 constituted by tin oxide ($SnO_2$) or indium tin oxide (ITO) and the like is formed on the first resin layer 2 to a thickness of 2000-5000 Å.

Figure 6:
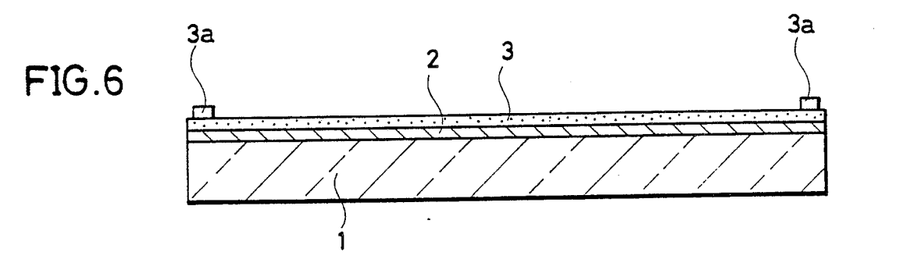
Figure 10:
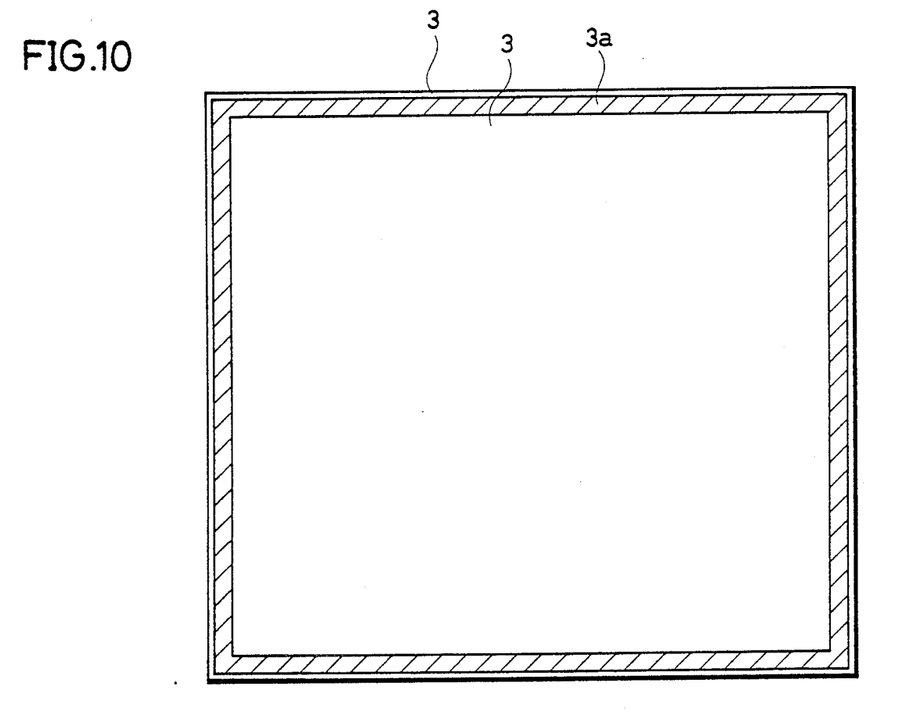
FIG. 10 is a top plan view corresponding to FIG. 6.

Referring to the sectional view of FIG. 6 and the top plan view of FIG. 10, a flexible locking member 3a is formed on the transparent electrode layer 3 along the inner periphery. This locking member 3a is provided for the purpose of securing the periphery of the semiconductor layer to be layered to the transparent electrode 3. The locking member 3a may be formed by applying a paste of polyimide type, for example, onto the transparent electrode 3 by screen process printing with a pattern of 100-150 $\mu$m in width and 10-20 $\mu$m in height, and baking the pattern of the paste for approximately 30 minutes at a temperature of approximately 250° C.

Figure 7:
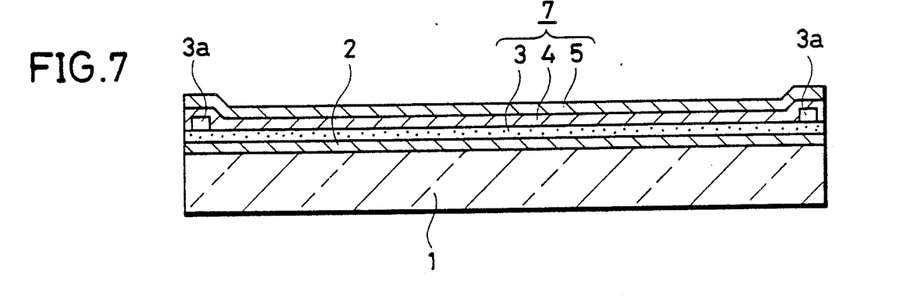

Referring to FIG. 7, the transparent electrode 3 and the locking member 3a are covered by the semiconductor layer 4 for photoelectric conversion. The semiconductor layer 4 has a thickness of approximately 3000-7000 Å, comprising a semiconductor junction such as a p-i-n junction or p-n junction parallel to the film face. As the semiconductor layer 4, a layer comprising amorphous silicon (a-Si), amorphous silicon carbide (a-SiC), or amorphous silicon germanium (A-SiGe) and the like may be formed by a plasma CVD method or a photo-assisted CVD method. A metal back electrode 5 having a thickness of approximately 4000 Å-2 $\mu$m is formed on the semiconductor layer 4. The back electrode 5 may comprise a single layer structure of aluminum (Al), a double layer structure of Al and titanium (Ti), a double layer structure of Al and titanium silver alloy (TiAg), or other multilayer structures. Thus, a photoelectric conversion element 7 is formed comprising the transparent electrode 3, the semiconductor layer 4, and the back electrode 5.

Figure 8:
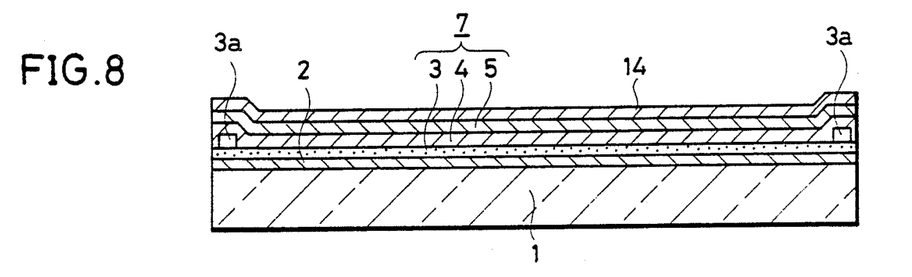

Referring to FIG. 8, a second flexible and insulating resin layer 14 is formed on the back electrode 5 to a thickness of approximately 0.1-1.0 mm. The second resin layer 14 may be formed by arranging a thermoplastic resin sheet such as of EVA on the back electrode, and heating it to 100°-150° C., followed by exerting a pressure of 0.1-10 kg/$cm^2$ for thermal bonding.

Figure 9:
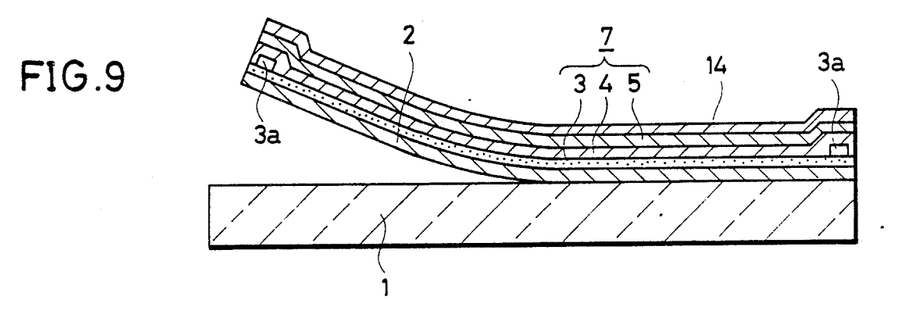

Referring to FIG. 9, the photovoltaic device supported on substrates 1 is immersed in water to separate the first resin layer 2 from the substrate 1. This results in a flexible photovoltaic device having the photoelectric conversion element 7 sandwiched between the first resin layer 2 and the second resin layer 14. In this flexible photovoltaic device, the peeling of the semiconductor layer 4 from the periphery of the transparent electrode 3 can be prevented even when subjected to bending stress or torsion stress because the periphery of the semiconductor layer 4 is firmly fixed to the transparent electrode 3 by the locking member 3a.

Although a flexible photovoltaic device having only a single photoelectric conversion element 7 included between the first resin layer 2 and the second resin layer 14 is described in the above mentioned first embodiment, a plurality of photoelectric conversion elements 7 connected electrically in series or in parallel may be included between the first resin layer 2 and the second resin layer 14.

The second embodiment of the present invention will be described with reference to FIGS. 11-14.

Figure 11:
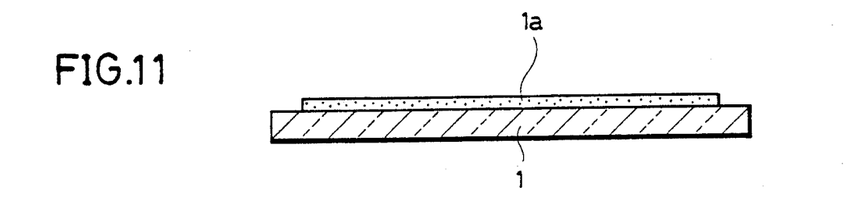
FIGS. 11-13 are sectional views showing the manufacturing steps of a flexible photovoltaic device in accordance with another embodiment of the present invention.

Referring to FIG. 11, a releasing agent layer 1a of silicone resin is applied onto the main surface of the supporting substrate 1 such as glass, within a region slightly smaller than the main surface thereof. The releasing agent layer 1a is applied by screen process printing, for example, to a thickness of 5-20 $\mu$m, with a margin of 1-5 mm in width at the periphery of the main surface of the supporting substrate 1. The applied releasing agent layer 1a is baked at a temperature of 250° C.-300° C.

Figure 12:
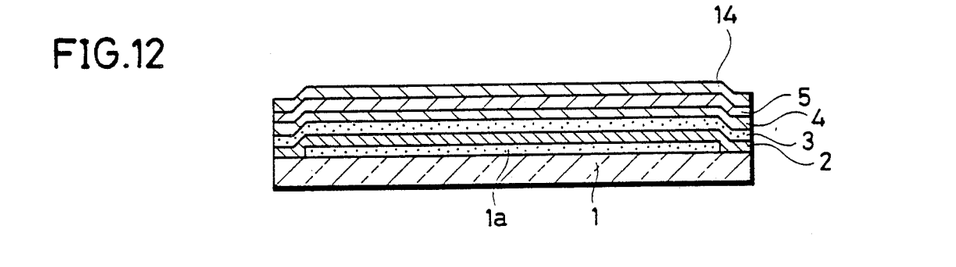

Referring to FIG. 12, the main surfaces of the releasing agent layer 1a and the supporting substrate 1 are covered by the first resin layer 2 such as of polyimide. Similarly to the first embodiment, a transparent electrode 3, a semiconductor layer 4, and a metal back electrode 5 are layered in sequence on the first resin layer 2. A second resin layer 14 of thermoplastic resin sheet such as EVA is formed on the back electrode 5 to a thickness of approximately 20 $\mu$m-1 mm. Thus, a photovoltaic device supported on the substrate 1 is completed.

Figure 13:
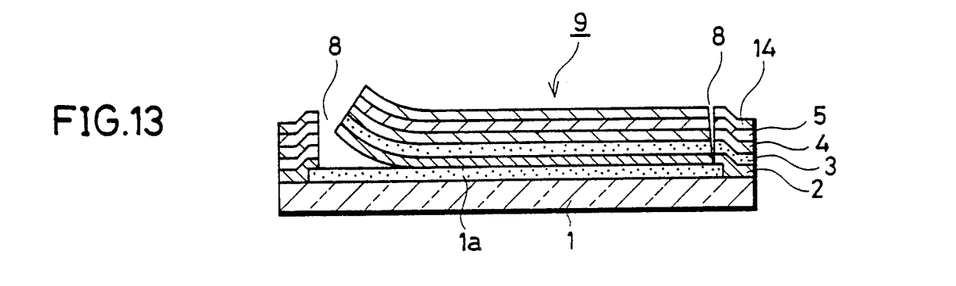
Figure 14:
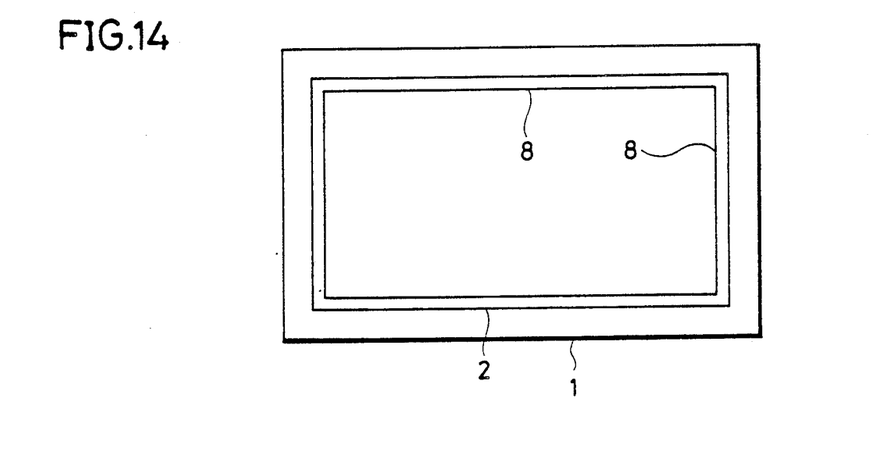
FIG. 14 is a top plan view corresponding to FIG. 13.

Referring to the sectional view of FIG. 13 and the top plan view of FIG. 14, the photovoltaic device is cut island-like using a laser beam, for example, along the inner periphery of the releasing agent layer 1a. The photovoltaic device cut island-like is located only above the releasing agent layer 1a, to be easily separated from the releasing agent layer for obtaining a flexible photovoltaic device 9. The flexible photovoltaic device 9 can be easily separated from the supporting substrate 1 in a short period without the substrate being immersed in water. During the formation process of the photovoltaic device, the first resin layer 2 is firmly fixed to the margin of the main surface of the substrate 1 remaining along the outer periphery of the releasing agent layer 1a, until the second resin layer 14 is formed.

The third embodiment of the present invention is described in reference to FIGS. 15-19.

Figure 15:
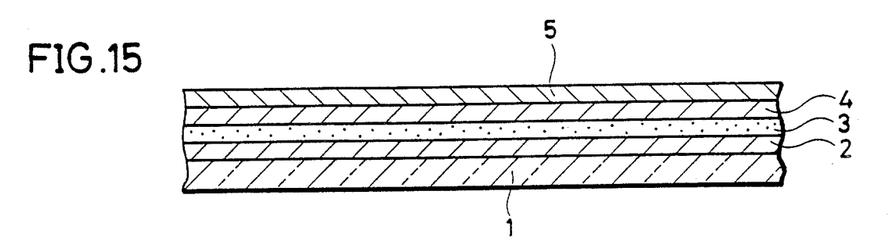
FIGS. 15-19 are sectional views showing the manufacturing steps of a flexible photovoltaic device in accordance with a still further embodiment of the present invention.

Referring to FIG. 15, a first resin layer 2, a transparent electrode 3, a semiconductor layer 4, and a metal back electrode 5 are layered in sequence on the supporting substrate 1, similar to the first embodiment.

Figure 16:
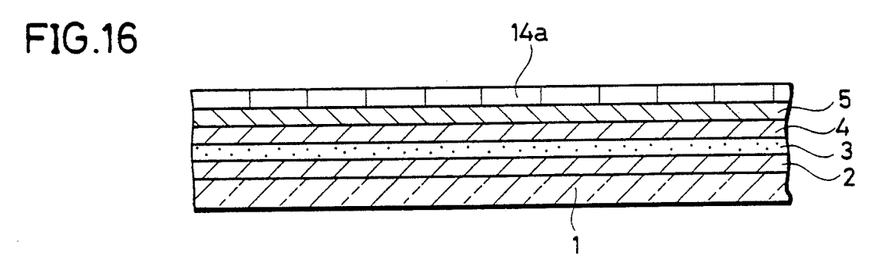

Referring to FIG. 16, a second resin layer 14a having a high shrinking force is formed to a thickness of approximately 20 μm-1 mm on the back electrode 5. The shrinking force of the second resin layer 14a is greater than that of the first resin layer 2, so as to curl in a concave manner the side of the second resin layer of the photovoltaic device of multilayered structure. The second resin layer 14a can be formed by applying a thermosetting varnish of polyimide type or acrylic type, for example, onto the back electrode 5 uniformly using a spinner, a roll coater, a spray or the like, followed by a rise in temperature to 100° C.-200° C. The second resin layer 14a may alternatively be formed by layering a thermoplastic resin sheet such as EVA of approximately 20 μm-100 μm in thickness, and a moisture-proof film such as polyethylene telephthalate (PET) or fluorine-containing resin of approximately 20 μm-1 mm in thickness in sequence, whereby the double layer film is heated to a temperature of 100° C.-150° C. and a pressure of 0.1-10 kg/cm² is applied thereto for thermal bonding. The second resin layer 14a formed in the above manner generates shrinking force when cooled down to room temperature from the raised temperature.

Figure 17:
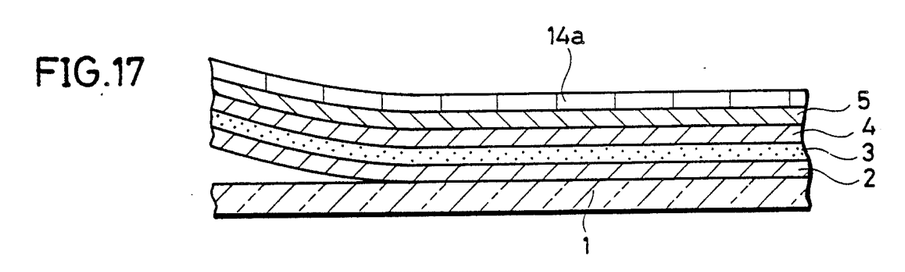

Referring to FIG. 17, the photovoltaic device formed on the supporting substrate 1 is immersed in water to separate the first resin layer 2 from the supporting substrate 1. Because the shrinking force of the second resin layer 14a which is greater than that of the first resin layer 2 acts so as to curl the second resin layer side of the photovoltaic device of the multilayered structure in a concave manner, the first resin layer 2 is separated from the substrate 1 in a relatively short time of 30 minutes to 10 hours.

Figure 18:
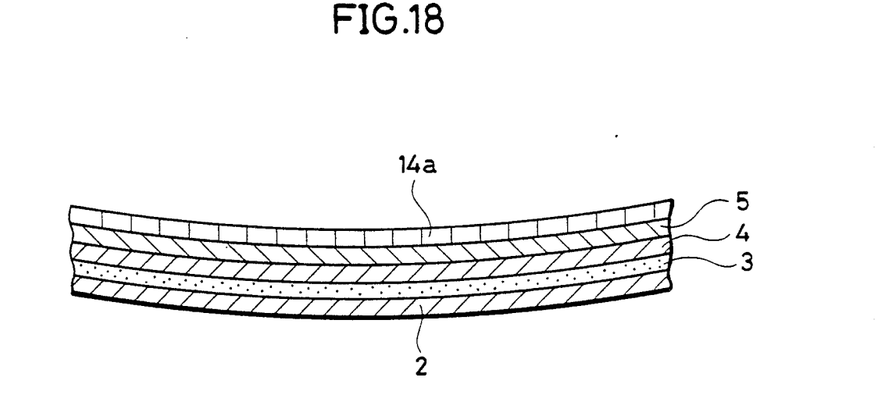

Referring to FIG. 18, the flexible photovoltaic device separated from the supporting substrate 1 has the second resin layer side curled in a concave manner due to the shrinking force of the second resin layer 14a. The second resin layer 14a generates a great shrinking force in proportion to the thickness thereof. Although it is possible to separate the photovoltaic device from the supporting substrate 1 in a shorter period if the shrinking force of the second resin layer 14a is great, the radius of curvature of the curl of the photovoltaic device after the separation will become smaller. The transparent electrode 3 and the semiconductor layer 4 are susceptible to local separation if the radius of curvature of the curl becomes too small. Therefore, it is preferred that the second resin layer 14a has a shrinking force which generates a radius of curvature of the curl of approximately 2 cm-10 cm.

Figure 19:
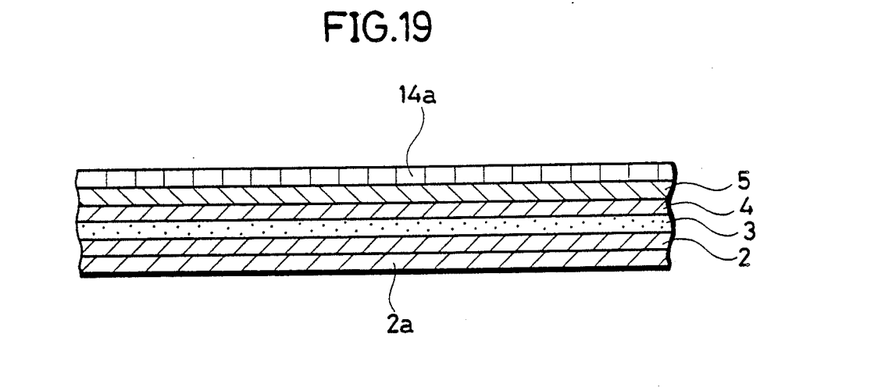

Referring to FIG. 19, a third transparent and flexible resin layer 2a having shrinking force is formed on the free surface of the first resin layer 2. A thermo-setting varnish of polyimide type or acrylic type, for example, is applied uniformly onto the free surface of the first resin layer 2 using a roll coater, a spray, or the like, and heated to a temperature of 100° C.-200° C., to form the third resin layer 2a having a thickness of approximately 20 μm-1 mm. The third resin layer 2a may alternatively be formed by layering a thermoplastic resin sheet such as of EVA of approximately 20 μm-100 μm in thickness and a film superior in moisture-proofness such as of PET or fluorine-containing resin of approximately 20 μm-1 mm in thickness on the free surface of the first resin layer 2 in sequence, whereby the double layer film is heated to 100° C.-150° C. and a pressure of 0.1-10 kg/cm² is applied thereto for thermal bonding.

The bending moment caused by the shrinking force of the third resin layer 2a cancels the bending moment caused by the shrinking force of the second resin layer 14a, to straighten and flatten the curl of the flexible photovoltaic device.

In the case where the second resin layer 14a and the third resin layer 2a comprise a moisture-proof PET film or a fluorine-containing resin film, the undesired effect of moisture on the transparent electrode 3, the semiconductor layer 4, and the metal back electrode 5 is prevented to obtain a flexible photovoltaic device of high reliability.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A flexible photovoltaic device comprising:
    a first transparent, insulating, and flexible resin layer,
    a transparent electrode formed on said first resin layer,
    a flexible resin type locking member having adherence formed along the inner periphery of said transparent electrode,
    a semiconductor layer formed so as to cover said transparent electrode and said locking member for photoelectric conversion,
    a back electrode formed on said semiconductor layer, and
    a second insulating and flexible resin layer formed on said back electrode.

2. The flexible photovoltaic device according to claim 1, wherein said locking member is formed of polyimide type resin.

3. The flexible photovoltaic device according to claim 1, wherein said first resin layer is formed of polyimide type resin.

4. The flexible photovoltaic device according to claim 3, wherein the first resin layer is formed to a thickness of 5-100 μm.

5. The flexible photovoltaic device according to claim 1, wherein said second resin layer is formed of a thermoplastic resin sheet.

6. The flexible photovoltaic device according to claim 5, wherein said thermoplastic resin comprises EVA.

7. A method of manufacturing a flexible photovoltaic device, comprising the steps of:
- forming a releasing agent layer on a main surface of a supporting substrate, excluding the inner peripheral margin thereof,
- forming a first transparent, insulating, and flexible resin layer so as to cover said margin and said releasing agent layer,
- forming a transparent electrode, a semiconductor layer for photoelectric conversion, and a back electrode on said first resin layer in sequence,
- forming a second insulating and flexible resin layer on said back electrode,
- creating a cut in the multilayer structure from said second resin layer to said first resin layer along the inner periphery of said releasing agent layer, and
- peeling said multilayer structure cut island-like from said releasing agent layer.

8. The method according to claim 7, wherein said cut is created in the multilayer structure from said second resin layer to said first resin layer by a laser beam.

9. The method according to claim 7, wherein said releasing agent layer is formed using silicone resin.

10. The method according to claim 9, wherein said silicone resin is applied to a thickness of 5–20 μm by screen process printing, followed by baking at a temperature within the range of 250° C.–300° C.

11. A method according to claim 7, wherein said margin has a width of 1–5 mm.

12. A flexible photovoltaic device comprising:
- a first transparent, insulating, and flexible resin layer,
- a transparent electrode formed on one side of said first resin layer,
- a semiconductor layer formed on said transparent electrode for photoelectric conversion,
- a back electrode formed on said semiconductor layer,
- a second insulating and flexible resin layer having shrinking force formed on said back electrode, and
- a third transparent and flexible resin layer having shrinking force formed on the other side of said first resin layer,
- wherein the bending moment within said photovoltaic device caused by the shrinking force of said second resin layer is cancelled by the bending moment caused by the shrinking force of said third resin layer.

13. The flexible photovoltaic device according to claim 12, wherein each of said second and third resin layers is formed by a member selected from the group consisting of thermosetting resins of polyimide type and acrylic type.

14. The flexible voltaic device according to claim 12, wherein each of said second and third resin layers is formed by a member selected from the group consisting of a double layer of EVA and PET, and a double layer of EVA and resin of fluorine-containing type, whereby said photovoltaic device is protected from moisture.

15. A method of manufacturing a flexible photovoltaic device, comprising the steps of:
- forming a first transparent, insulating, and flexible resin layer on a supporting substrate,
- forming a transparent electrode, a semiconductor layer for photoelectric conversion, and a back electrode on said first resin layer in sequence,
- forming a second insulating and flexible resin layer having shrinking force on said back electrode,
- separating said first resin layer from said supporting substrate in a relatively short time by using the shrinking force of said second resin layer, and
- forming a third transparent and flexible resin layer having shrinking force on the free surface of said first resin layer,
- wherein the bending moment in said photovoltaic device caused by the shrinking force of said second resin layer is cancelled by the bending moment caused by the shrinking force of the third resin layer.

16. The method according to claim 15, wherein said first resin layer is separated from said supporting substrate in water.

17. The method according to claim 15, wherein each of said second and third resin layers is formed by applying a member selected from the group consisting of thermosetting varnish of polyimide type and acrylic type, and being heated.

18. The method according to claim 15, wherein each of said second and third resin layers is formed by layering sheets of EVA and PET, and applying a predetermined pressure for thermal bonding.

19. The method according to claim 15, wherein each of said second and third resin layers is formed by layering sheets of EVA and fluorine-containing type resin and applying a predetermined pressure for thermal bonding.

* * * * *